US009291664B2

(12) United States Patent
Gaggl

(10) Patent No.: US 9,291,664 B2
(45) Date of Patent: Mar. 22, 2016

(54) DEVICE FOR HIGH VOLTAGE TESTING OF SEMICONDUCTOR COMPONENTS

(76) Inventor: Rainer Gaggl, Drobollach (AT)

( * ) Notice: Subject to any disclaimer, the term of this patent is extended or adjusted under 35 U.S.C. 154(b) by 93 days.

(21) Appl. No.: 14/005,635

(22) PCT Filed: Mar. 12, 2012

(86) PCT No.: PCT/AT2012/000060
§ 371 (c)(1),
(2), (4) Date: Sep. 17, 2013

(87) PCT Pub. No.: WO2012/122578
PCT Pub. Date: Sep. 20, 2012

(65) Prior Publication Data
US 2014/0002118 A1 Jan. 2, 2014

(30) Foreign Application Priority Data

Mar. 17, 2011 (AT) .................................. A 371/2011

(51) Int. Cl.
G01R 31/02 (2006.01)
G01R 15/14 (2006.01)
G01R 31/26 (2014.01)
G01R 31/12 (2006.01)

(52) U.S. Cl.
CPC .......... *G01R 31/2601* (2013.01); *G01R 31/129* (2013.01); *G01R 31/2642* (2013.01)

(58) Field of Classification Search
CPC ........... G01R 31/2889; G01R 1/07378; G01R 1/0408
USPC .................. 324/750.01, 437, 754.01, 754.03, 324/754.07, 755.01, 755.11, 756.03, 690; 269/21; 438/14, 17; 439/482
See application file for complete search history.

(56) References Cited

U.S. PATENT DOCUMENTS

2007/0126440 A1* 6/2007 Hobbs et al. .................. 324/754
2007/0247177 A1* 10/2007 Ruckenbauer ..... G01R 31/2891
324/750.19

FOREIGN PATENT DOCUMENTS

AT 412175 B * 9/2004
AT 412 175 10/2004
(Continued)

OTHER PUBLICATIONS

Rainer Gavel, Ph.D., ( "Under Pressure —from High Voltage to MEMS Pressure Sensors Wafer Probing," IEEE SW Test Workshop, Jun. 8 to 11, 2008), 16.*
Gaggl R., Oct. 25, 2004, B.*
(Continued)

*Primary Examiner* — Minh N Tang
*Assistant Examiner* — Taqi Nasir
(74) *Attorney, Agent, or Firm* — Young & Thompson

(57) ABSTRACT

A device for avoiding spark discharge during high voltage testing of semiconductor components on semiconductor wafers, includes a pressure chamber provided for the semiconductor wafer in a sealed manner, and having a pressurized gas feed so that the interior thereof is subjected to overpressure and thus the sparking voltage for a spark discharge between contact faces is higher than the maximum test voltage to be applied. The pressure chamber is connected to a probe card including contact probes. The pressure chamber has a movable part, which is movable relative to the parts of the pressure chamber connected to the probe card. An air bearing in the gap between the pressure chamber and the semiconductor wafer holds the movable part of the pressure chamber in a sealed manner spaced from the surface of the semiconductor wafer. The movable part is pressed by a spring force towards the semiconductor wafer.

18 Claims, 2 Drawing Sheets

(56) References Cited

FOREIGN PATENT DOCUMENTS

| AT | 412175 B | * 10/2004 | ........... G01R 31/129 |
|---|---|---|---|
| DE | 196 30 316 | 1/1998 | |
| DE | 10 2006 018474 | 10/2007 | |
| WO | 2006/093349 | 9/2006 | |

OTHER PUBLICATIONS

Rainer Gavel, Ph.D., ( "Under Pressure—from High Voltage to MEMS Pressure Sensors Wafer Probing," IEEE SW Test Workshop, Jun. 8 to 11, 2008), 16.*

International Search Report dated Jul. 20, 2012, corresponding to PCT/AT2012/000060.
Austrian Search Report dated Jan. 17, 2012; corresponding to the Foreign Priority Application No. A 371/2011.

Rainer Gaggl, Ph.D., Under Pressure—from High Voltage to MEMS Pressure Sensors Wafer Probing, 16 pages, Jun. 8 to 11, 2008, IEEE SW Test Workshop, US.†

\* cited by examiner
† cited by third party

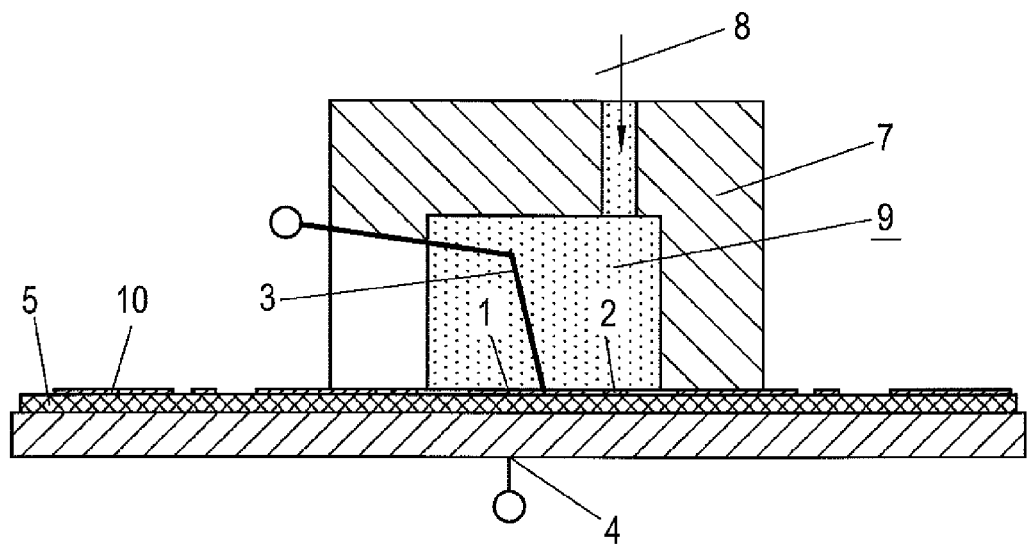
Fig. 1 "prior art"
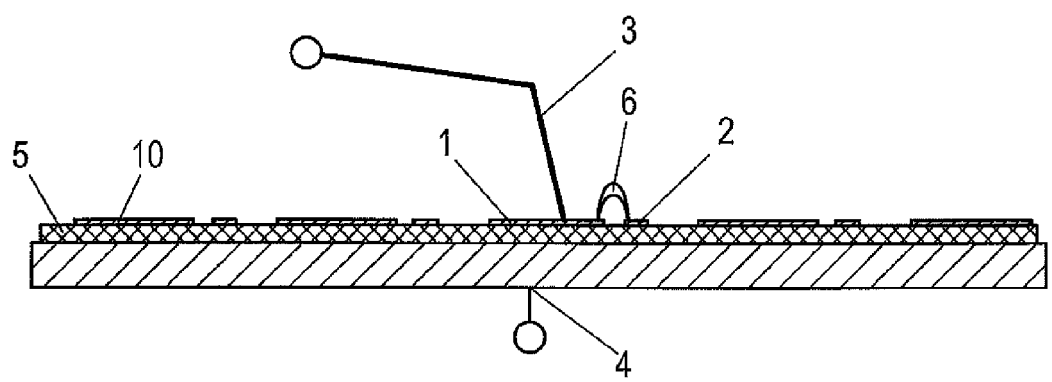
Fig. 2 "prior art"

DEVICE FOR HIGH VOLTAGE TESTING OF SEMICONDUCTOR COMPONENTS

The invention relates to a device for high voltage testing of semiconductor components.

Within the scope of the invention, both semiconductor components (hereinafter called "chips") that have not yet been removed (broken out) of the semiconductor wafers and also separated chips that have already been cut out of semiconductor wafers are considered.

In electrical testing of semiconductor components, high voltage components, such as, for example, high voltage transistors, IGBTs or diodes, are tested for their dielectric strength by application of high voltage. In doing so, the chips that are not yet installed in a housing and that are located, for example, in a semiconductor wafer, still lying on one another (not yet separated), are exposed to electrical high voltage via test contacts on the contact surfaces of the front of the chip or a conductive carrier plate on the back of the chip, and the electrical properties, such as, for example, the leakage current for a blocked component, are measured.

In this testing, depending on the chip geometry and the level of the test voltage between contact surfaces on the chip, high electrical field strengths can occur such that unwanted (spark) discharges occur between contact surfaces and via the atmosphere (air). Conventionally, contact is not made with the other chips lying next to the chip that is to be tested and with which contact has been made on one semiconductor wafer on the front of the chip so that also no spark discharges occur in them.

From AT 412 175 B, an arrangement is known with which spark discharges can be avoided in high voltage testing by the measurement being taken under elevated gas pressure. AT 412 175 B exploits the circumstance that the sparkover field strength depends on the gas pressure, the igniting voltage of the sparking increasing with rising gas pressure. In the device known from AT 412 175 B, the chip that has been exposed to the high voltage during the measurement process as a whole or partially, at least in the regions at risk of sparkover, is exposed to an elevated gas pressure (for example, elevated air pressure). At sufficiently high gas pressure, the igniting voltage of the spark discharge can be increased above the test voltage that is present at maximum on the test piece, and sparkovers on the chip can be effectively suppressed. In AT 412 175 B, a pressure chamber is used that is seated on the semiconductor component that is to be tested (for example, the chip). The pressure chamber that is open on one side is closed by seating on the semiconductor component, and an overpressure is built up in the pressure chamber via a pressurized gas feed over the test piece.

Making electrical contact with the test piece generally takes place via elastic contact needles ("probes") that are conventionally mounted on a circuit board for feed of electrical signals. Such a contact-making device is also called a needle card ("probe card"). The combination of a probe card with a pressure chamber in an arrangement for high voltage testing of semiconductor components that is addressed in general in AT 412 175 B is technically demanding to the extent that, on the one hand, the test contacts with contact feeds of less than 10 μm (typically roughly 75 μm) are pressed on the contact surfaces of the semiconductor component, and furthermore, the pressure chamber must be advanced exactly onto the semiconductor component in order to achieve relatively reliable sealing between the semiconductor component and the pressure chamber.

A position once selected is soon changed by wear of the test tips in series testing of semiconductor components so that the pressure chamber is seated on the semiconductor component before the contact tips, and ultimately the electrical contact with the contact tips becomes defective due to the overly low contact pressure of the contact tips. In many cases, contact between the pressure chamber and semiconductor component is also not desirable since due to impurities (for example, particles that can cause semiconductor wafer fractures) that are present in the region of the contact surface between the pressure chamber and the semiconductor component, damage to the semiconductor component (chip) can occur, regardless of whether or not the latter has already been separated from the semiconductor wafer.

The object of the invention is to further configure a device as is known from AT 412 175 B and as is described above, such that a combination of a pressure chamber with a probe card is advantageously possible.

This object is achieved according to the invention with a device that has the features of claim 1.

Preferred and advantageous configurations of the invention are the subject matter of the dependent claims.

In the invention, the pressure chamber that is combined with a probe card has at least one part that is connected to the probe card and that cannot move relative to the latter and at least one part that is used as a ring seal and that is movable relative to the probe card perpendicular to the plane of the probe card. Thus, the pressure chamber can follow movements of the semiconductor component (chip or semiconductor wafer) in the feed of the contacts of the probe card with its (at least one) movable part.

The movable ring seal, i.e., the at least one movable part of the pressure chamber of the device according to this invention, can follow changes in the contact feed and can also compensate for wear of the contacts of the test probes. Thus, a position is always possible that is correct for the wear of the pressure chamber relative to the semiconductor component.

In one embodiment of the invention, the movable part (ring seal) of the pressure chamber is loaded by springs in the direction to the semiconductor component onto which the pressure chamber is to be placed, and thus a seal is reliably produced between the pressure chamber and the semiconductor component. The point is to reduce the risk of damaging the semiconductor wafer or chip by particles (see above) by corresponding selection of the spring force of the spring used.

In one embodiment of the invention, it is provided that the sealing takes place between the pressure chamber and the semiconductor component using a gas (air) bearing. In this way, the movable part of the pressure chamber (ring seal) is kept floating over the surface of the semiconductor component (semiconductor wafer or chip). Gas bearings, as they are being used here, have the property of building up high bearing forces as the gap becomes narrower and thus counteracting a (further) narrowing of the gap. Thus, contact between the ring seal and the surface of the semiconductor component (wafer surface) and thus the risk of damage of the semiconductor component can be reliably prevented.

In another embodiment of the device according to the invention, it is ensured that the set pressure in the pressure chamber is built up before the start of the high voltage testing. This reliably prevents spark discharges that remain unnoticed under certain circumstances and that can mean a risk for later failure of the semiconductor component. In order to monitor the pressure build-up in the pressure chamber, the device according to the invention, especially its pressure chamber, can be assigned an electrical pressure sensor or pressure switch that monitors the pressure in the interior of the pressure chamber, and when a minimum pressure is not reached, it prevents high voltage from being applied to the semiconductor component that is to be tested. Such a pressure sensor or pressure switch, either one, can be installed directly in the pressure chamber. In another embodiment, the pressure sensor or pressure switch can be connected to the interior of the pressure chamber via a line that is directed out of the pressure chamber. Finally, within the scope of the invention, there is the possibility of arranging the pressure sensor or pressure switch in the feed line via which pressurized gas (compressed air) is routed into the pressure chamber so that failure to reach a specified pressure or else a pressure drop in the pressure chamber can also be detected here.

BRIEF DESCRIPTION OF THE DRAWINGS

Other details and features of the invention will become apparent from the following description of preferred exemplary embodiments shown schematically. Here:

FIG. 1 shows a device of the generic type, as is known from AT 412 175 B,

FIG. 2 schematically shows the problem that is solved with the invention,

DETAILED DESCRIPTION OF THE PREFERRED EMBODIMENTS

Figure 3:
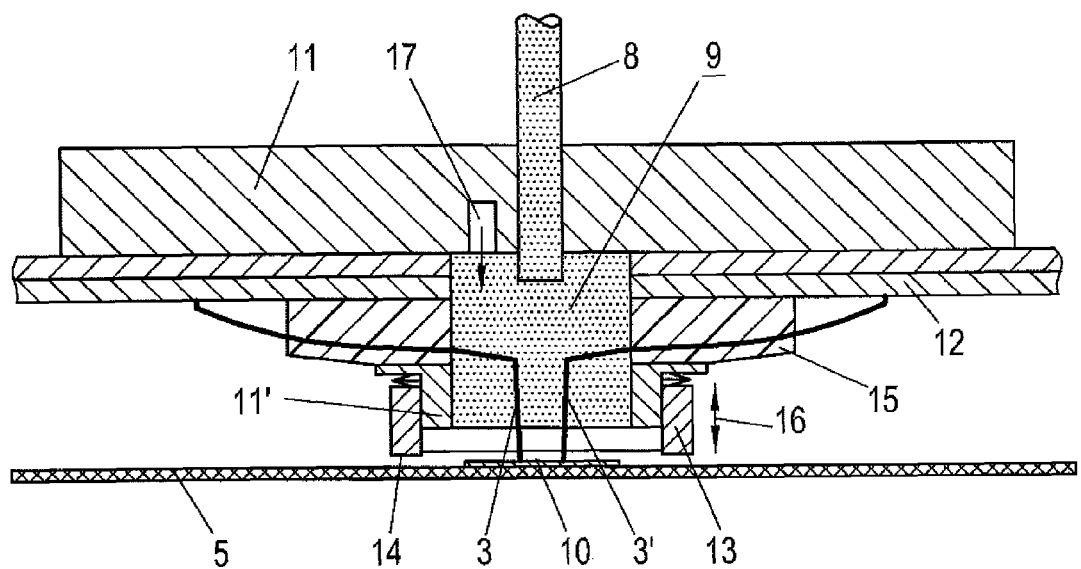
FIG. 3 shows a first embodiment of a device according to the invention.

In the (known) device according to FIG. 1, there is a semiconductor wafer 5 in which there are several chips 10, but not yet separated from this semiconductor wafer 5, i.e., which have not yet been broken out. Each chip 10 has contact surfaces 1 and 2 shown schematically in FIG. 1. In order to test the chip 10, a test voltage is applied via a test probe 3 that is placed on the contact surface 1 of the chip, on the one hand, and via electrical contact-making 4 on the back of the chip and an electrically conductive connection that is located in the chip structure, on the other hand, by electrical high voltage being applied via the test probe 3 and the contact-making 4.

When high voltage is applied, depending on the chip geometry and the level of the test voltage between the contact surfaces 1 and 2, as indicated in FIG. 2, unwanted spark discharges 6 can occur between contact surfaces 1 and 2 via the atmosphere (air).

In other measuring arrangements, the high voltage can be applied solely to the top of the chip via contact probes 3, 3' for purposes of testing (as shown in, for example, FIG. 3). In doing so, high field strengths and thus the risk of spark discharges occur not only between contact surfaces 1, 2 of the chip, but also between the contact probes 3, 3' themselves. Since, in one embodiment of the invention, the regions (for example, tips) of the contact probes 3, 3' are located within the pressure chamber 7 provided according to the invention, spark discharges between the probes can also be prevented with the device according to the invention.

In the device known from AT 412 175 B, over the region of the semiconductor wafer 5 to be tested (the chip 10 to be tested in the latter), a pressure chamber 7 is moved into position whose interior 9 is pressurized via a pressurized gas feed 8. The pressure chamber 7 is open toward the chip surface. After seating the pressure chamber 7 on the semiconductor wafer 5, overpressure is built up via the pressurized gas feed 8 in the interior 9 of the pressure chamber 7 above the chip 10.

In the embodiment of a device according to the invention that is shown in FIG. 3, the pressure chamber 7 consists of two parts 11 and 11' that are connected permanently to the probe card 12, the parts 11 and 11' being located on sides of the probe card 12 that are opposite to one another. In the part 11 of the pressure chamber 7, which part is located on the side of the probe card 12 turned away relative to the semiconductor wafer 5 that is to be tested, there is a gas feed 8 for the pressure chamber 7 that discharges into the interior 9 of the pressure chamber 7. The part 11' of the pressure chamber 7 located on the side of the probe card 12 facing the semiconductor wafer 5 is attached to the probe card 12 via a ring 15 of electrically insulating material. The test probes 3 and 3' for making electrical contact with the chip 10 that in the illustrated embodiment is still in the semiconductor wafer 5—and therefore has not been broken out of the latter—are directed through the ring 15 of electrically insulating material.

The pressure chamber 7 in the embodiment shown in FIG. 3 furthermore has at least one annular part 13 that can be adjusted in the direction of the double arrow 16 relative to the parts 11 and 11' of the pressure chamber 7 that are connected to the probe card 12, i.e., essentially perpendicular to the plane of the semiconductor wafer 5 and the probe card 12. Between the part 11' of the pressure chamber 7 that is located on the side of the probe card 12 facing the semiconductor wafer 5 and the movable part 13 of the pressure chamber 7, there is (at least) one spring (not shown) that loads the part 13 of the pressure chamber 7 that is used as a ring seal in the direction to the semiconductor wafer 5.

Figure 4:
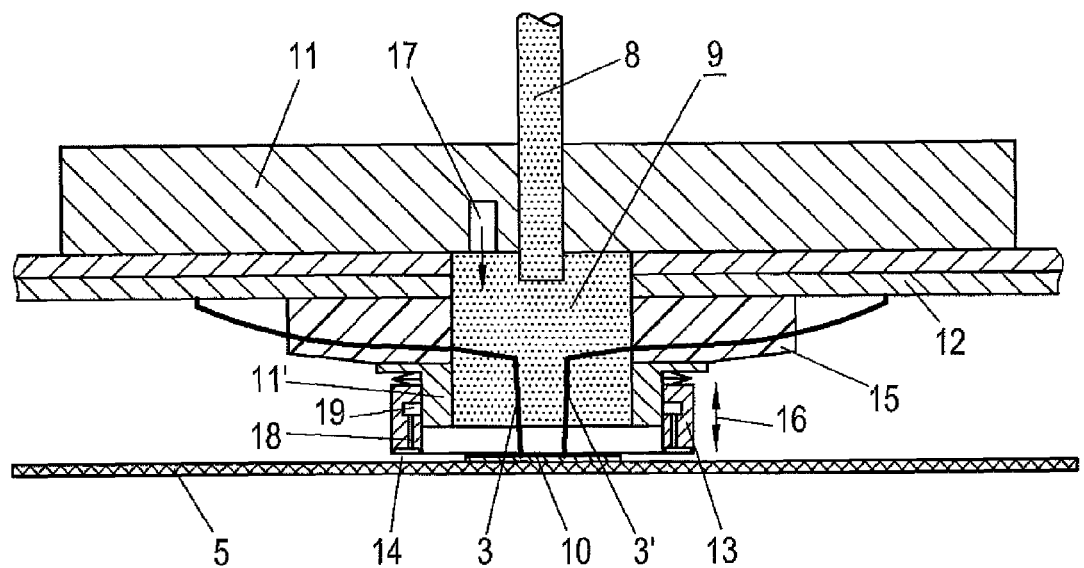
FIG. 4 shows a second embodiment of a device according to the invention.

In the embodiment of a device according to the invention that is shown in FIG. 4, in the gap 14 between the movable part 13 and the semiconductor wafer 5, an air bearing is made that is formed by compressed air emerging through the gap 14 between the movable part 13 and the top of the semiconductor wafer 5. As explained above, it is achieved by this air bearing that the annular part 13 is kept, however, at a distance from the top of the semiconductor wafer 5, forming a seal. The air bearing in the gap 14 is exposed to compressed air via an annular channel 19 (groove that opens radially to the inside in the part 13) and axially parallel channels 18. The channels 18 discharge into, for example, round depressions in the circular front surface of the movable part 13 facing the semiconductor wafer 5. These depressions are located, for example, uniformly distributed over the front surface of the part 13. The compressed air can be taken from the interior 9 of the pressure chamber 7 or can be supplied to the channel 19 via separate lines (not shown).

In contrast to a device that is known from, for example, DE 102006018474 A1 and in which a gas gap is established by means of mechanical actuators and correspondingly assigned distance sensors, a "floating" air bearing that is used within the scope of the invention is especially advantageous. The (static) air bearing used within the scope of the invention is characterized in that throttling yields a gap-dependent bearing force that in interplay with the loading of the seal by means of a spring in the direction of the semiconductor wafer 5 leads to a seal gap that is set by self-regulation—without additional means such as actuators or distance sensors that are necessary for stabilization of a gas gap, for example according to DE 102006018474 A1.

In the embodiment of the device according to the invention that is shown in FIG. 3 and in FIG. 4, a pressure sensor 17 (shown by symbols) is assigned to the interior 9 of the pressure chamber 7. As already mentioned above, the pressure sensor 17 can also be connected to the interior 9 of the pressure chamber 7 via a line. The pressure sensor 17 (or a pressure switch that acts analogously) can, however, also be assigned to the gas feed 8. It is essential that the pressure sensor 17 or pressure switch detects the pressure in the interior 9 of the pressure chamber 7 and allows the application of the test voltage only when the prescribed minimum pressure that is sufficient to prevent spark discharges 6 at the test voltage (FIG. 2) is reached.

The monitoring of the pressure in the interior 9 of the pressure chamber 7 using a pressure sensor 17 or a pressure switch is advantageous especially when using the device according to the invention in automated testing of large quantities of semiconductor components, since in any case it is ensured that the set pressure has also in fact always been built up before the start of the high voltage testing in the pressure chamber 7.

Within the scope of the invention, one embodiment of the device is also considered in which there is more than one pressure chamber 7 with a movable part 13 (ring seal) on a probe card 12.

With the device according to the invention, it is possible to subject one individual semiconductor component (chip 10) or, moreover, two or more semiconductor components to a high voltage test.

In summary, one exemplary embodiment of the invention can be described as follows.

A device for preventing spark discharges in high voltage testing of semiconductor components (chips 10) on semiconductor wafers 5 comprises a pressure chamber 7 that can be advanced to the semiconductor wafer 5 in a sealed manner with a pressurized gas feed 8 so that the interior 9 of the pressure chamber 7 is placed under an overpressure, and in this way, the igniting voltage for a spark discharge between contact surfaces 1, 2 is higher than the test voltage that is to be applied at maximum. The pressure chamber 7 is connected to a probe card 12 with contact probes 3. The pressure chamber 7 has one movable part 13 that can be moved relative to the parts 11 and 11' of the pressure chamber 7 that are connected to the probe card 12. The movable part 13 of the pressure chamber 7 is held by an air bearing in the gap 14 between the pressure chamber 7 and the semiconductor wafer 5 at a distance from the surface of the semiconductor wafer 5 in a sealed manner. Within the scope of the invention, there is at least one part 13 that can move freely relative to the probe card 12 or one part 13 that is pressed by means of spring force in the direction of the semiconductor wafer 5.

The invention claimed is:

1. A device for electrical high voltage testing of at least one semiconductor component, comprising: a pressure chamber with an interior in fluid communication with a gas line and configured to be placed under an overpressure via the pressurized gas line, said pressure chamber located on a probe card with test probes, and said pressure chamber having at least one part that is moveable relative to the probe card, wherein a gap, in which an air bearing is formed, is located between the a front surface of the movable part of the pressure chamber facing the semiconductor component, and
wherein the movable part has an annular channel formed within an interior of the movable part, in fluid connection with axially parallel channels that exit in a direction of the gap to conduct compressed air from the annular channel through the parallel channels to expose the compressed air to the air bearing in the gap.

2. The device according to claim 1, wherein the movable part is made as a ring seal.

3. The device according to claim 1, wherein the part of the pressure chamber can be moved essentially perpendicular to the plane of the probe card or the semiconductor component that is to be tested.

4. The device according to claim 1, wherein the part of the pressure chamber connected to the probe card has two parts that are located on sides of the probe card that are opposite to one another.

5. The device according to claim 1,
wherein the part of the pressure chamber located on the side of the probe card facing the semiconductor component that is to be tested is located on the probe card over a ring of electrically insulating material, and
wherein the test probes of the probe card are directed through the ring.

6. The device according to claim 1, wherein there is at least one spring between the part of the pressure chamber connected to the probe card and the movable part of the pressure chamber.

7. The device according to claim 1, wherein the pressure chamber is assigned an apparatus for monitoring the pressure in the interior of the pressure chamber.

8. The device according to claim 7, wherein the apparatus is a pressure switch or a pressure sensor.

9. The device according to claim 7, wherein the apparatus for monitoring the pressure in the interior is assigned directly to the pressure chamber.

10. The device according to claim 7, wherein the apparatus for monitoring the pressure in the interior of the pressure chamber is connected to the interior via a line.

11. The device according to claim 7, wherein the apparatus for monitoring the pressure in the interior of the pressure chamber is assigned to the pressurized gas feed.

12. The device according to claim 2, wherein the part of the pressure chamber can be moved essentially perpendicular to the plane of the probe card or the semiconductor component that is to be tested.

13. The device according to claim 8, wherein the apparatus for monitoring the pressure in the interior is assigned directly to the pressure chamber.

14. The device according to claim 1, wherein the movable part comprises round depressions in the front surface of the moveable part facing the gap, said channels discharging into said depressions.

15. The device according to claim 14, wherein the front surface of the movable part is circular, and the depressions are uniformly distributed over the front surface.

16. The device according to claim 1, wherein the movable part is annular and surrounds an extended lower part of the pressure chamber.

17. The device according to claim 16, wherein the movable part comprises round depressions in the front surface of the moveable part facing the gap, said channels discharging into said depressions.

18. The device according to claim 17, wherein the front surface of the movable part is circular, and the depressions are uniformly distributed over the front surface.

* * * * *